(12) United States Patent
Stewart et al.

(10) Patent No.: US 10,798,843 B2
(45) Date of Patent: Oct. 6, 2020

(54) COMPUTER RACK LIFTER STRUCTURE

(71) Applicants: Raleigh D. Stewart, Fairfax, VA (US); Jody B. DuMond, Fairfax, VA (US)

(72) Inventors: Raleigh D. Stewart, Fairfax, VA (US); Jody B. DuMond, Fairfax, VA (US)

( * ) Notice: Subject to any disclaimer, the term of this patent is extended or adjusted under 35 U.S.C. 154(b) by 107 days.

(21) Appl. No.: 16/200,174

(22) Filed: Nov. 26, 2018

(65) Prior Publication Data

US 2020/0170138 A1    May 28, 2020

(51) Int. Cl.
*B66F 3/46*    (2006.01)
*H05K 7/14*    (2006.01)
*B66F 9/04*    (2006.01)
*B66F 3/24*    (2006.01)
*H05K 7/18*    (2006.01)

(52) U.S. Cl.
CPC ............ *H05K 7/1488* (2013.01); *B66F 9/04* (2013.01); *B66F 3/24* (2013.01); *B66F 3/46* (2013.01); *H05K 7/18* (2013.01)

(58) Field of Classification Search
CPC ...... B66F 5/00; B66F 7/22; B66F 3/00; B66F 3/24; B66F 7/16; B66F 9/04; B66F 3/46; H05K 7/1488; H05K 7/18

USPC ..................... 254/134, 93 R, 89 H
See application file for complete search history.

(56) References Cited

U.S. PATENT DOCUMENTS

2014/0151618 A1* 6/2014 Stewart ............... B66F 3/44
254/89 R

* cited by examiner

*Primary Examiner* — Lee D Wilson
(74) *Attorney, Agent, or Firm* — John L. Sotomayor (57) ABSTRACT

An apparatus is described that forms a lifting and lowering assembly for equipment racks, or other equipment items, by attaching lifters onto a computer equipment rack, and other datacenter equipment, in order to allow the equipment or equipment rack to be raised or lowered vertically without unloading the equipment rack. The lifters mounted on the equipment rack are controlled by a remote control passing signals through a power supply/relay control box that are connected to the rack mounted lifters. Through the attachment and activation of rack mounted lifters, the assembly may raise and lower fully loaded equipment racks in a vertical direction to assist in the maintenance and relocation of equipment racks or other data center equipment.

18 Claims, 9 Drawing Sheets

Figure 8 ically delicate due to the nature of the equipment item or electronic equipment installed within the fully loaded equipment rack. Moving the fully loaded rack and large and heavy equipment using some methods presents risks of equipment damage, damage to the rack, and personnel injury. Attempting to push a loaded rack or heave equipment item to move it presents a risk of the equipment or rack tipping over. Moving a loaded rack with a hand truck reduces some of these risks, but typically racks, and the equipment they house, and large, heavy equipment items are not designed to be moved from a perpendicular orientation with respect to the floor and damage may result. There is also the risk of the rack or other equipment tipping

COMPUTER RACK LIFTER STRUCTURE

COPYRIGHT NOTICE

A portion of the disclosure of this patent document contains material which is subject to copyright protection. The copyright owner has no objection to the facsimile reproduction of the patent document or the patent disclosure, as it appears in the Patent and Trademark Office patent file or records, but otherwise reserves all copyright rights whatsoever.

BACKGROUND

In a data center environment, relocating a rack of equipment traditionally requires almost all of the servers, switches, and other pieces of racked gear to be removed from the rack prior to moving the rack. An equipment rack is typically sized at approximately 19 inches wide, approximately 30 inches from front to back, and may have a variable height, but is typically approximately 72 to 84 inches in height. The equipment rack has channels, conduits and connections for power, cooling, and data communications such that electronic equipment may be inserted into slots in the rack and powered and cooled through the use of the rack services. Removing equipment from the rack prior to moving the rack reduces the weight, thus permitting the rack to be readily relocated. The rack is then moved either by attempting to manually move it across the floor, or by using a hand truck (dolly) to move the rack. Moving the rack using a hand truck or dolly requires the rack to be inclined at some angle to the floor, moving the rack out of perpendicular orientation with the floor. Relocating datacenter equipment that is not installed within a rack but is nevertheless large and heavy presents issues similar to the relocation of a loaded equipment rack.

Moving a rack while it is still fully loaded has some advantages. Chief among these advantages is the fact that moving a loaded rack saves the time required to disconnect and reconnect all of the pieces of equipment that are installed in the rack from the power and data connections of rack services, which can be quite tedious. Moving a rack when fully loaded also removes much of the risk of cabling errors that may occur when the network data, communication, and power cables are reconnected to the devices installed in the rack.

Moving a fully loaded rack or large and heavy items of datacenter equipment also presents some major challenges. Chief among the challenges is that a fully loaded rack is extremely heavy, in the range of approximately 2000-3000 pounds. Raising a fully loaded equipment rack, or other large equipment, up off of the floor upon which it rests to begin a relocation action is a big challenge when the rack or other equipment is very heavy, yet phys when attempting to restore the rack or other equipment to an upright, perpendicular orientation with respect to the floor.

BRIEF DESCRIPTION OF THE DRAWINGS

Certain illustrative embodiments illustrating organization and method of operation, together with objects and advantages may be best understood by reference detailed description that follows taken in conjunction with the accompanying drawings in which.

DETAILED DESCRIPTION

While this invention is susceptible of embodiment in many different forms, there is shown in the drawings and will herein be described in detail specific embodiments, with the understanding that the present disclosure of such embodiments is to be considered as an example of the principles and not intended to limit the invention to the specific embodiments shown and described. In the description below, like reference numerals are used to describe the same, similar or corresponding parts in the several views of the drawings.

The terms "a" or "an", as used herein, are defined as one or more than one. The term "plurality", as used herein, is defined as two or more than two. The term "another", as used herein, is defined as at least a second or more. The terms "including" and/or "having", as used herein, are defined as comprising (i.e., open language). The term "coupled", as used herein, is defined as connected, although not necessarily directly, and not necessarily mechanically.

Reference throughout this document to "one embodiment", "certain embodiments", "an embodiment" or similar terms means that a particular feature, structure, or characteristic described in connection with the embodiment is included in at least one embodiment of the present invention. Thus, the appearances of such phrases or in various places throughout this specification are not necessarily all referring to the same embodiment. Furthermore, the particular fea tures, structures, or characteristics may be combined in any suitable manner in one or more embodiments without limitation.

As used here, "footprint" refers to a vertical, downward projection of an object onto the surface that supports the object. The portion of the supporting surface that is within the footprint is, by definition, underneath the object.

As used herein, "ratchet strap", also known as a tie-down, tie-down strap, or lashing strap, refers to a fastener for holding cargo in place during transit. A ratchet strap may comprise one or more straps, one or more hooks, and tie-down hardware. As non-limiting examples, the straps may be composed of nylon and the tie-down hardware may be a ratchet. By way of example and not of limitation, a ratchet strap may be used by wrapping the strap around or over the cargo, hooking the hooks onto the cargo vehicle, and operating the ratchet to tighten the straps against the cargo. In a non-limiting example, the ratchet strap may be used by wrapping the strap around the cargo and around a support structure, hooking the free ends of the strap to each other, and operating the ratchet to secure the cargo to the support structure. It is common to use multiple ratchet straps at one time to secure a cargo.

The term "or" as used herein is to be interpreted as an inclusive or meaning any one or any combination. Therefore, "A, B or C" means "any of the following: A; B; C; A and B; A and C; B and C; A, B and C". An exception to this definition will occur only when a combination of elements, functions, steps or acts are in some way inherently mutually exclusive.

There is a need for a device or apparatus to permit the relocation of a datacenter equipment rack while the equipment rack is fully or partially loaded, and without having to remove and reinsert any equipment from the equipment rack before or after the relocation event. Additionally, the device or apparatus may be used to support and relocate datacenter equipment other than a datacenter equipment rack. There is also a need for a system, apparatus or device that may be configured to raise an equipment item or an equipment rack having equipment installed within the rack to be raised above the level of the floor or other horizontal surface upon which the equipment item or equipment rack rests to permit the installation of the device to be used to relocate the equipment item or equipment rack. Such a device or apparatus could be installed at the base of the equipment rack or other item of datacenter equipment and be of sufficient sturdiness, size and shape to support the fully or partially loaded equipment rack or other item of datacenter equipment before, during and after a relocation action. In some embodiments, the device or apparatus, which for purposes of this disclosure will be termed a pallet-like base for a datacenter equipment rack, may be installed as a base member of a datacenter equipment item or equipment rack.

In some embodiments, the installation of the pallet-like base must be accomplished by first raising the equipment item or equipment rack in a substantially vertical direction above the floor or other horizontal surface upon which it rests in order to provide sufficient clearance beneath the equipment item or equipment rack to insert and install the pallet-like base. In an exemplary embodiment, this vertical movement may be performed by an equipment rack lift assembly. The equipment rack lift assembly may consist of one or more lift actuators, one or more power supply/relay control boxes, and one or more tethered remote control units. In an exemplary configuration for use in lifting a single, fully loaded datacenter electronic equipment rack, the equipment rack lift assembly may consist of four lift actuators, to be installed at each of the four corners of the rack, one power supply/relay control box, and one tethered remote control unit. It is to be understood, however, that this configuration is simply one exemplary configuration designed to permit the vertical elevation of one type of equipment rack, and the equipment rack lift assembly is in no way restricted to use in this single embodiment. Other equipment racks and equipment items may require a different configuration of lift actuators, power supply/relay control boxes, and tethered remote control units, and the equipment rack lift assembly may be configured to permit such different configurations of the components of the assembly.

The equipment rack lift assembly may be configured such that lift actuators may be attached to an equipment item or equipment rack so as to raise the equipment item or equipment rack in a substantially vertical direction while maintaining the vertical orientation of the equipment item or equipment rack within pre-established parameters for tilt away from vertical orientation during the lifting action. The vertical lift is accomplished through commands sent by a control unit to the lift actuators to raise or lower the equipment item or equipment rack to which they are attached.

Once raised to a pre-determined distance above the floor or other horizontal surface, the pallet-like base may be installed as a device capable of supporting and moving a fully loaded rack through the use of a moving device such as a pallet jack or one or more safe movers inserted beneath the pallet-like base supporting the datacenter equipment item or equipment rack. The equipment rack lift assembly thus permits the heavy datacenter equipment or equipment racks to be lifted in a vertical orientation to permit the installation of an apparatus such as a pallet-like rack in support of relocation and reconfiguration actions for an equipment item or equipment rack without unloading or otherwise disassembling the equipment item or equipment rack.

An apparatus and system for moving datacenter equipment in a vertical orientation, comprising a plurality of equipment lifting components, each of them mountable to an item of equipment, a power supply, a relay control in electrical communication with each of the plurality of equipment lifting components, and a remote control in electrical communication with the relay control and configured to control the action of each of the plurality of equipment lifting components. Each of the equipment lifting components comprise an electro-mechanical or hydraulic actuator in association with an electric activation motor, an external cylinder and an internal cylinder where the internal cylinder extends from and retracts into the external cylinder when the electric activation motor activates the electro-mechanical or hydraulic actuator.

In the apparatus and system the power supply is separate from the equipment lifting components. The remote control comprises at least one activation switch for each equipment lifting component and an activation switch for activating all equipment lifting components simultaneously, and each activation switch comprises an internal lighting element where said lighting element activates when the activation switch is electrically connected to the power supply. The power supply and relay control are co-located within a single component, and the remote control is electrically connected to the power supply/relay control and the power supply/relay control is electrically connected to the activation motor associated with each equipment lifting component. Each equipment lifting component comprises a load-bearing element, where the equipment lifting component load bearing elements are connected to an equipment item or equipment rack in a configuration sufficient to support the weight of the equipment item or equipment rack during lifting actions.

In the apparatus and system, the equipment lifting components are fastened to the equipment item or equipment rack through the load-bearing elements associated with each equipment lifting component, the equipment lifting components are electrically connected to activation switches associated with the remote control and then to the power supply/relay control, where lighting elements associated with activation switches on said remote control are active when electrical connectivity is established, where the equipment lifting components are active to raise and lower an equipment item or equipment rack when said activation switches are activated by an operator.

An important aspect of the equipment lifting components according to embodiments of the invention is that areas of contact between the plurality of equipment lifting components and a surface supporting the item of equipment remain outside of the footprint of the item of equipment. The equipment lifting components are therefore never an obstacle to placing the pallet-like base under the item of equipment.

In some embodiments, an actuator frame on each of the equipment lifting components may comprise one or more pairs of retention notches located on the side of the actuator frame that is opposite the equipment rack. Each of the one or more pairs of retention notches are paired at the same height on the actuator frame and multiple pairs of retention notches may be provided at multiple heights on the actuator frame. The one or more pairs of retention notches may prevent one or more ratchet straps from slipping down the side of the actuator frame. The one or more ratchet straps may be used to secure the equipment rack or other equipment to the actuator frame of each of the equipment lifting components.

In some embodiments, the bottom of the actuator frame may comprise a lifting foot. The lifting foot may protrude laterally from the bottom of the actuator frame in the direction of the equipment rack. The lifting foot may be placed under the equipment rack or other item of equipment to prevent the equipment rack from sliding down the side of the actuator frame. In some embodiments, the lifting foot may be removable and/or replaceable.

Figure 1:
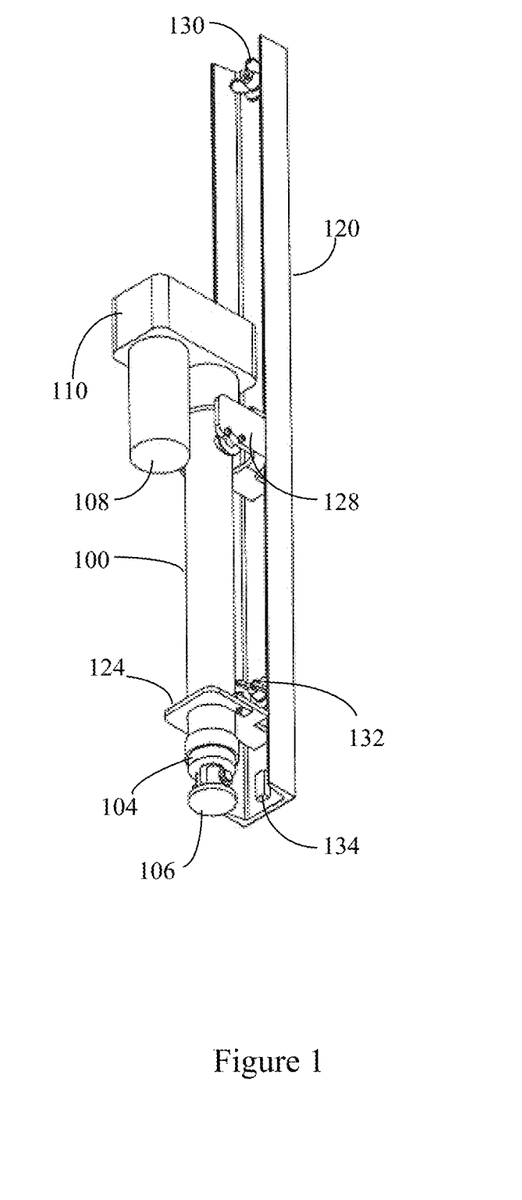
FIG. 1 is a diagram of a front view of a rack mount lifter consistent with certain embodiments of the present invention.

Turning now to FIG. 1, consistent with certain embodiments of the invention this figure presents a diagram of a front view of a rack mount lifter that may be attached to datacenter equipment items or equipment racks. A rack mount lifter, in a non-limiting example, is a component of the equipment rack lift assembly that may be connected to an equipment item or equipment rack to permit the vertical movement to raise the equipment item or equipment rack above a floor or other horizontal surface such that the equipment item or equipment rack is no longer in contact with the floor or other horizontal surface. In an exemplary configuration, the rack mount lifter may comprise an external cylinder 100 and a lifting cylinder 104 having a base foot 106 connected to the end of the lifting cylinder 104. The lifting cylinder 104 extends from the external cylinder 100 when activated.

In this exemplary embodiment, an electric motor 108 is attached to an activation unit 110 into which the external cylinder 100 is connected to provide the impulse and power to extend the lifting cylinder 104 under the direction of a tethered remote control unit (not shown). In a non-limiting embodiment, the activation unit 110 may be screw-type, electromechanical actuator. However, other types of electro-mechanical or hydraulic actuators may be used in different embodiments to achieve similar capability. A benefit of the screw-type, electro-mechanical actuator is that when power is removed from the system, the loss of power will not cause the actuator to drop the load. The activation unit 110 is connected to the upper end of the lifting cylinder 104 such that, when an electric current is supplied to the activation unit 110 by the electric motor 108, the activation unit 110 causes the lifting cylinder 104 to be extended or retracted under the direction of a remote control unit (not shown). The remote control unit may send a signal to the electric motor 108 to provide the signal to begin operation of the rack mount lifter and the direction of travel, either extension or retraction of the lifting cylinder 104 within the external cylinder 100. The activation and extension or retraction of the lifting cylinder 104 provides the lifting and lowering action for the portion of the equipment item or equipment rack to which the rack mount lifter is attached.

The external cylinder 100 is mounted within an actuator frame 120. The external cylinder 100 is inserted into a lower mount 124 that is connected to the actuator frame 120 at a position approximately 6 to 8 inches above the bottom edge of the actuator frame 120. This position of the lower mount 124 is provided as an example only and should in no way be considered limiting, as other positions of the lower mount 124 attachment to the actuator frame 120 may be used without departing from the spirit of the invention. The lower mount 124 may have a circular opening through which the external cylinder 100 is inserted, providing for a secure attachment to the actuator frame 120 for the end of the external cylinder 100 from which the lifting cylinder 104 extends. The top portion of the external cylinder 100 may be attached to the actuator frame 120 at an upper mount 128. When the external cylinder 100 is inserted into the lower mount 124 and connected to the upper mount 128, the external cylinder 100, and all portions of the lift actuator connected to the external cylinder 100, is securely mounted within the actuator frame 120 and the unit is ready to be connected to an equipment item or equipment rack. The actuator frame 120 is attached to an equipment item or equipment rack by attaching an integral, load-bearing hook 134 extending from the end of the actuator frame 120 and positioned to fit into an opening in the exterior of the equipment item or equipment rack. In an exemplary embodiment, after inserting the load-bearing hook 134 into the equipment item or equipment rack, the actuator frame 120 may be fastened in place by securing an upper mounting bolt 130 and a lower mounting bolt 132 through pre-set holes in the actuator frame 120 that correspond to mounting holes in the corner portion of the equipment item or equipment rack. When the actuator frame 120 is securely connected to an equipment item or equipment rack either through the use of the load-bearing hook 134 or the load-bearing hook in combination with the upper mounting bolt 130 and the lower mounting bolt 132, the rack lift actuator is properly configured to begin lifting and lowering actions.

Figure 2:
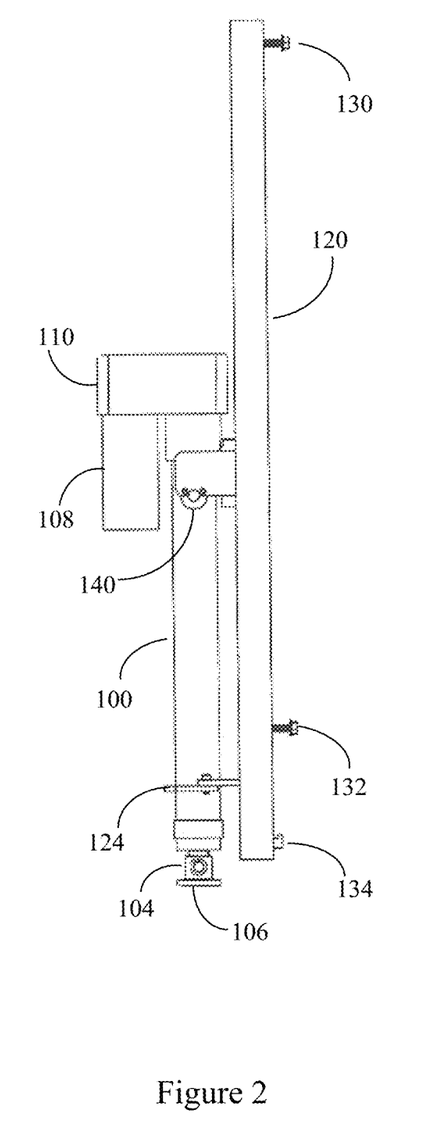
FIG. 2 is a diagram of a side view of a rack mount lifter consistent with certain embodiments of the present invention.

Turning now to FIG. 2, this figure presents a diagram of a side view of a rack mount lifter consistent with certain embodiments of the present invention. The actuator as described above with respect to FIG. 1 may be fastened to an equipment item or an equipment rack by inserting the load-bearing hook 134 through a pre-set hole in the exterior surface of the equipment item or equipment rack. The load-bearing hook 134 is position on the bottom portion of the actuator frame, extending perpendicularly from the back surface of the actuator frame 120 and bending through a ninety degree angle to form a hook and a load-bearing surface that will be in contact with the exterior surface of the equipment item or equipment rack. The horizontal surface of the load-bearing hook 134 may be used to support the weight of one portion of the equipment item or equipment rack through raising and lowering operations. In an alternative embodiment, the upper mounting bolt 130 and the lower mounting bolt 132 may be set through pre-set holes in the actuator frame 120 and through existing holes in load bearing members of the equipment item or equipment rack and fastening the actuator frame 120 to the equipment item or equipment rack for greater stability during raising and lowering operations. In an exemplary embodiment, the activation unit 110 may be connected to a power supply/relay control box (not shown) through a pre-set connector 140 disposed at the upper end of the external cylinder 100, permitting access by the control unit to start and stop the activation unit 110 under user control.

Figure 3A:
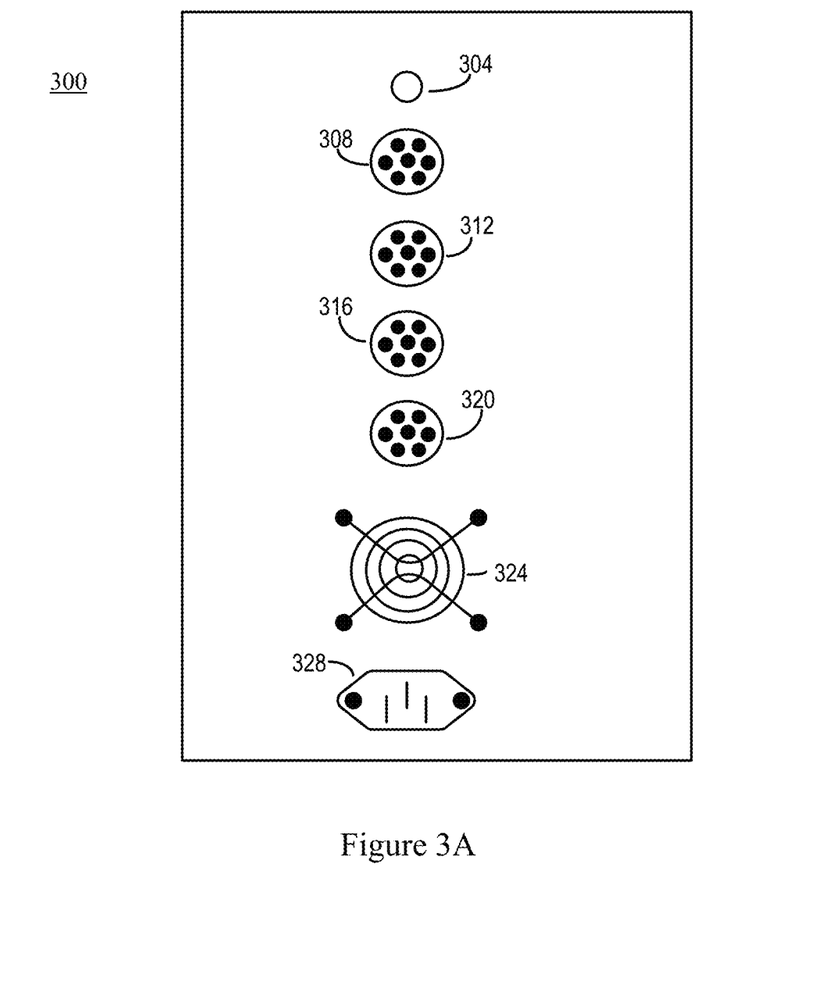
FIG. 3A is a front control panel view of a rack mount lifter power supply/relay control consistent with certain embodiments of the present invention.

Turning now to FIG. 3A, is an external view of a power supply and relay control box 300 consistent with certain embodiments of the present invention. In an exemplary embodiment, the power supply and relay control box 300 provides both power and activation control signals to up to four actuators, either individually or simultaneously. In a non-limiting embodiment, the power supply and relay control box 300 may have an activation light 304 to provide a visual indication that the power supply/relay control box is ready to provide both power and control signals to up to four rack lift actuators. The power and control signals are provided to each rack lift actuator through a connector mounted in the external wall of the power supply and relay control box 300. In a non-limiting example, the connector may be a 7-pin connector, however, any appropriate connector may be used to present the power and control signals to a rack lift actuator. In this exemplary embodiment, a first actuator connector 308 may be connected to a first rack lift actuator. The first actuator connector 308 may have pin assignments for power, extend lifting cylinder, retract lifting cylinder, and ground. Each of actuator connectors two through four (312, 316, 320) may have similar pin assignments, with the extend and retract lifting cylinder pin assignments set to different pins in each connector. The arrangement of pin assignments should in no way be considered limiting, as pin assignments may be changed based upon the type of connector provided and any additional functions to be connected, such as the connection of a pilot light associated with each rack lift actuator to provide an indication of when each particular rack lift actuator has been provided with a control signal to begin operation.

Additionally, to permit circulation of air within the power supply and relay control box 300, in the side panel of the case a circulation fan 324 may be installed. The circulation fan 324 permits the box to draw outside air into the interior of the power supply and relay control box 300 and to permit the outflow of air from the box. The circulation fan 324 provides necessary cooling to the power supply and relay control box 300 during system operation. The power supply and relay control box 300 also has a connector to an outside power source 328 to provide power to the entire system.

Figure 3B:
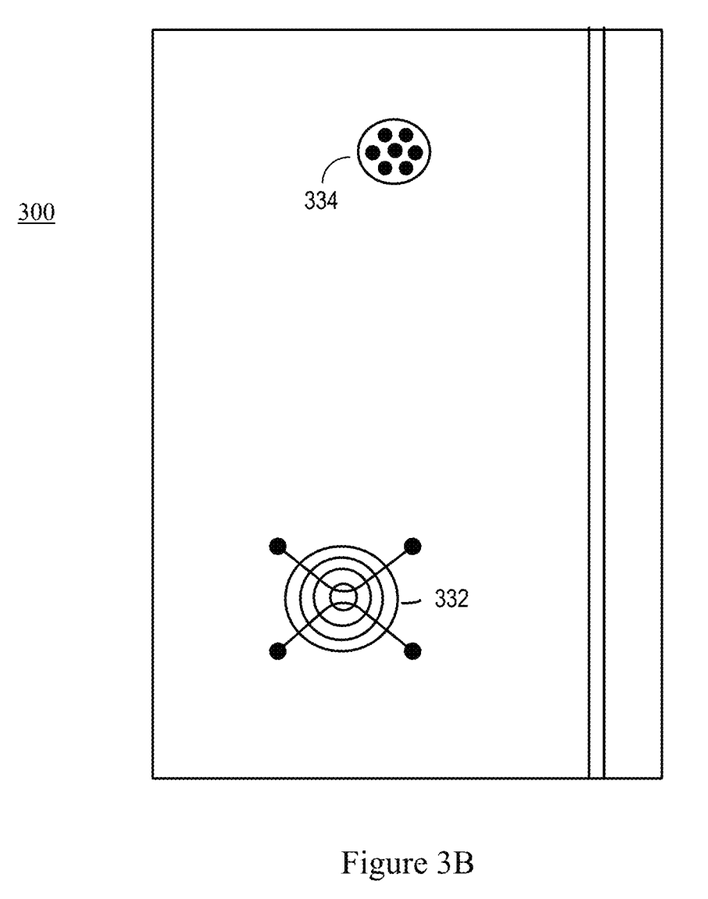
FIG. 3B is a back control panel view of a rack mount lifter power supply/relay control consistent with certain embodiments of the present invention.

FIG. 3B is a back control panel view of a rack mount lifter power supply/relay control consistent with certain embodiments of the present invention. The power supply/relay control box back panel provides another circulation fan 332 to be installed in the exterior surface of the power supply/relay control box. Additionally, a 7-pin connector 334 extends through the exterior casing of the control box. The 7-pin connector 334 may be used to connect a control cable from the power supply/relay control box to the remote control box to provide for electrical connectivity between the remote control box and the power supply/relay control box. The 7-pin connector 334 connects to the rack mount lifters through the power supply/relay control box to transfer signals from the remote control box to the rack mount lifters when the system is in operation.

Figure 4:
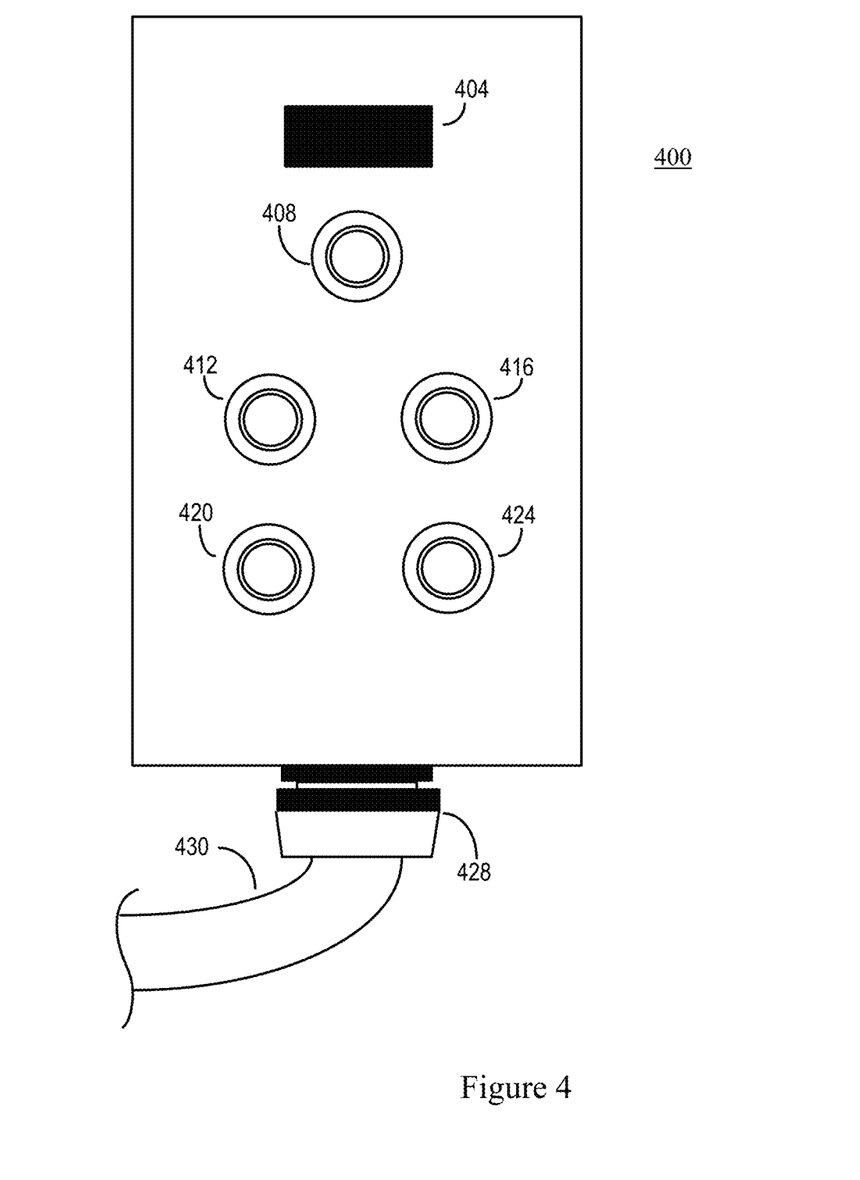
FIG. 4 is a control panel view of a rack mount lifter remote control consistent with certain embodiments of the present invention.

Turning now to FIG. 4, this figure presents a control panel view of a rack mount lifter remote control consistent with certain embodiments of the present invention. In a non-limiting embodiment, the remote control 400 may be configured to control direction and activation of one or more rack lifters. Control of the direction of movement of the one or more rack lifters may be performed through the position of a direction switch 404. The direction switch 404 may be a rocker type switch, a toggle switch, or any other type of switch that presents two switch positions for selection by the user. The direction switch 404 may be set in a first position, which may be labeled as the "UP" position, to provide a signal to the one or more rack lifters to extend the lifting cylinder of the one or more rack lifters to lengthen the rack lifter, which has the effect of raising an equipment item or equipment rack to which the rack lifter is fastened up off of a floor or other horizontal surface. Alternatively, if one or more of the rack lifters are in extension, a user may change the setting of the direction switch 404 to a second position, which may be labeled as the "DOWN" position, which may have the effect of causing the lifting cylinder of the one or more rack lifters to retract. This retraction of the lifting cylinder has the effect of shortening the length of the one or more rack lifters, thus lowering an equipment item or equipment rack to which the rack lifter is fastened down towards a floor or other horizontal surface.

The remote control 400 may also be configured to permit the selection of all rack lifters connected to the remote control 400 through the selection of the activate all lifters switch 408. In the non-limiting example provided in this figure, the remote control 400 may be configured to provide activation signals to four rack mount lifter activation switches (412, 416, 420, 424) as well as the activate all lifters switch 408. Other configurations of the number of rack mount lifters to be controlled by a single remote control 400 may be made without departing from the scope and spirit of the invention. A common configuration of four rack mount lifters may be used on many equipment items and equipment racks that have a square or rectangular form factor. The rack mount lift assembly may be configured to attach one rack mount lifter to each of the four corners of such equipment items or equipment racks so as to provide stability and equal balance of the load when raising and lowering the load through the use of the remote control 400. In addition to the activation of all rack mount lifters simultaneously, the activation of single rack mount lifters may be provided through the remote control 400.

In an exemplary embodiment, there may be configured a light source, such as an LED, light bulb, or other light source that is visible through the surface of the activation switches (412, 416, 420, 424) as well as the activate all lifters switch 408. The activation switches may be wired with jumpers between two pins in the seven pin connector so as to supply an active power source to the LED or light bulb when one or more rack mount lifters are connected to the power supply and relay control box 300. The jumper activates the LED, light bulb or other light source whenever the rack mount lifter cable is connected, in a non-limiting example the light source for the #1 rack mount lifter is electrically connected by the jumper between the two pins so as to light the LED, light bulb, or other light source associated with the first activation switch 412 on the remote control 400. Additionally, the light source for the activate all lifters switch 408 is also activated to produce light whenever any rack mount lifter is electrically connected to the power supply and relay control box 300. As each rack mount lifter is electrically connected, the corresponding LED, light bulb, or other light source is activated for that rack mount lifter. In this manner the operator may be aware of what rack mount lifters are electrically connected and active. If, in a non-limiting example, two rack mount lifters are connected into the power supply and relay control box 300 in positions that are not expected, or are not the same as connections made in an earlier operation, the operator will have a visual indication of which activation switch is connected to which rack mount lifter. In this example, the operator will know if the rack mount lifters are active and controlled by the expected activate switches, preventing an accidental operation of one or more rack mount lifters that would place the equipment item or equipment rack out of balance by activation of a rack mount lifter the operator did not expect to activate. The activation lights, therefore, provide verification of the electrical connectivity of rack mount lifters to the expected activation switches and permit the system to minimize operator error and to be used more safely.

A single rack mount lifter may be attached to a dedicated activation switch such as, in a non-limiting example, the connection of a first rack mount lifter to a first activation switch 412, lighting the LED or other activation light source and establishing electrical connectivity from the activation switch to the rack mount lifter. Pressing the first activation switch 412, which may be a pressure sensitive switch, mechanical contact switch, piezoelectric switch, or any other switch that provides for an on/off toggle switch activation, may send an activation signal to the attached rack mount lifter to extend or retract the lifting cylinder of the selected rack mount lifter. This individual selection and activation provides a user with the ability to raise and lower that portion of the equipment item or equipment rack to which the rack mount lifter is secured, providing an ability to compensate for tilting, uneven horizontal surface from which the equipment is being raised, variances in the speed of the attached rack mount lifters, or any other condition that threatens to place the equipment item or equipment rack in a non-vertical position. Each of the activation switches (412, 416, 420, 424) may be dedicated to a particular rack mount lifter.

The remote control 400 may be connected through a weather proof connector 428 to a group cable 430 that tethers all of the activation and direction control switches to the power supply and relay control box 300. The weather proof connector 428 permits the insertion of the group cable 430 into the remote control 400 enclosure without exposing the signal cables to adverse weather and climate conditions, providing for a robust connectivity scheme and protection for the signals transmitted to the rack mount lifters.

Figure 5:
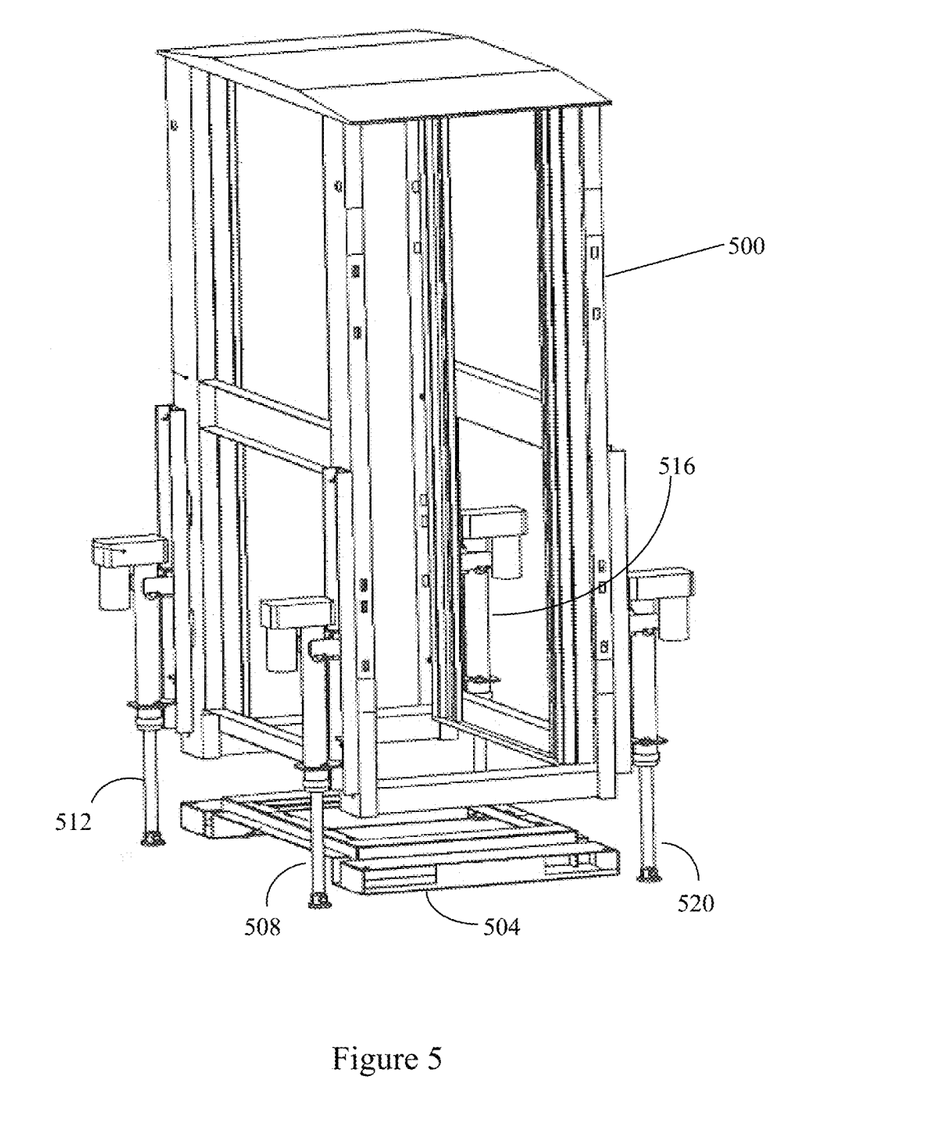
FIG. 5 is a view of a plurality of rack mount lifters installed on an equipment rack consistent with certain embodiments of the present invention.

Turning now to FIG. 5, which presents for certain embodiments of the invention a view of an illustrative view of vertical lifting of an equipment rack 500 for installation on a pallet-like base 504 when moving a fully loaded equipment rack consistent with certain embodiments of the present invention. To facilitate the installation or relocation of heavy datacenter equipment or equipment racks, the item of equipment or the equipment rack 500 may be installed on the pallet-like base 504 that will have length and width dimensions of approximately the same dimensions as the item of equipment or equipment rack. The vertical lift and positioning is provided through by four rack mount lifters (508, 512, 516, 520) each of which is fastened securely to one of the four corners of the equipment rack. The rack mount lifters (508, 512, 516, 520) are presented in an extended position which permits the raising of the equipment rack 500 above the floor or other horizontal surface, and maintaining the equipment rack 500 in a substantially vertical position. The equipment rack 500 may be held in this position, supported by the activated rack mount lifters (508, 512, 516, 520) while moving equipment is placed beneath the raised equipment rack. Additionally, in an alternative embodiment, raising the equipment rack 500 permits the installation of new equipment such as additional support structures or additional load-bearing pallet-like base equipment that will permit and facilitate the relocation and support of the equipment rack 500 without having to unload the equipment from the rack first.

After the pallet-like base 504 or other structural support structures have been emplaced, the rack mount lifters (508, 512, 516, 520) may be activated in a retract mode. In this mode, the lifting cylinders of the rack mount lifters (508, 512, 516, 520) move in the opposite vertical direction to that of the lifting action. In the lifting action, the lifting cylinders of the rack mount lifters (508, 512, 516, 520) are activated to extend the lifting cylinders out of the rack mount lifters (508, 512, 516, 520) to lengthen the rack mount lifters (508, 512, 516, 520) vertical dimension and lift the equipment rack 500 to which the rack mount lifters (508, 512, 516, 520) are attached. In the lowering action, the rack mount lifters (508, 512, 516, 520) are activated to retract the lifting cylinders so as to shorten the vertical length of the rack mount lifters (508, 512, 516, 520) and lower the equipment rack 500 that is attached back down until it is in contact with the pallet-like base 504 or other support structure or moving equipment that has been interposed in the space between the equipment rack 500 and the floor or other horizontal surface beneath the equipment rack 500.

Figure 6:
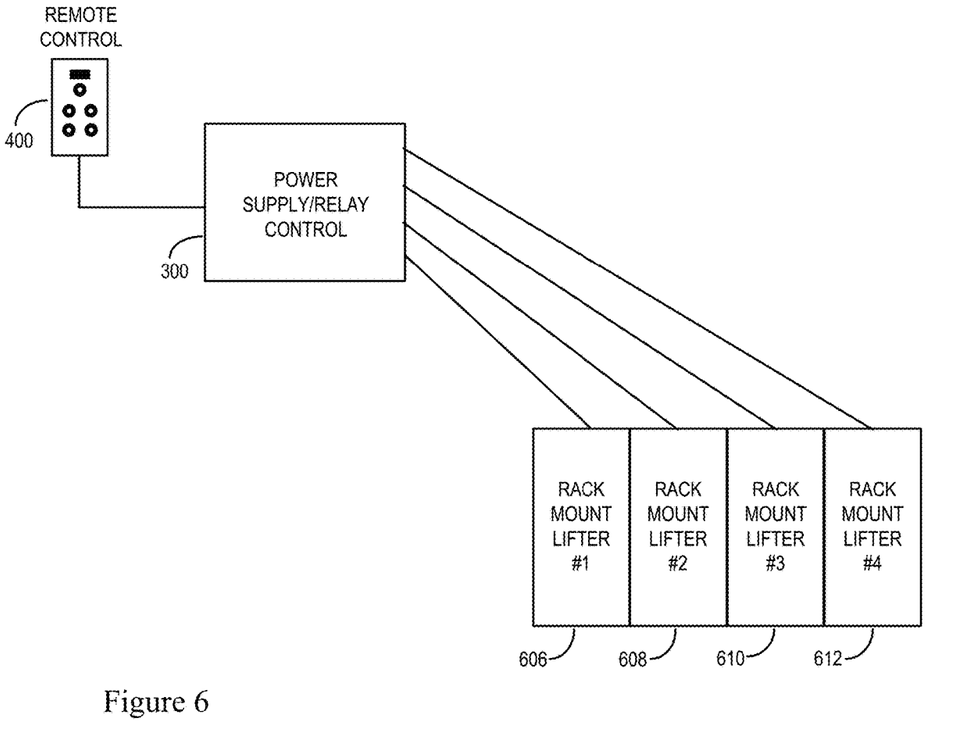
FIG. 6 is a diagram of rack mount lift assembly connectivity configuration consistent with certain embodiments of the present invention.

Turning now to FIG. 6, this figure presents a diagram of a rack mount lift assembly connectivity configuration consistent with certain embodiments of the present invention. In a non-limiting embodiment, the remote control 400 provides control signals to the system. The remote control 400 may be connected through any wired or wireless communication methodology having sufficient bandwidth to transmit selection and activation signals to the power supply and relay control box 300. In a non-limiting example, the remote control 400 may be connected to the power supply and relay control box 300 by a bundled 7-wire data communications cable. The data communications cable will be sufficient to transmit selection signals indicating extend/retract control and selection of one or more, including the selection of all, rack mount lifters (606, 608, 610, 612). The remote control 400 passes the extend/retract signal and user selected rack mount lifter identification signals to the power supply and relay control box 300, which then provides activation power, extend or retract signals to selected rack mount lifters (606, 608, 610, 612), and power to an activation lamp to provide a visual indication to a user of which rack mount lifters (606, 608, 610, 612) a presently active. In this exemplary embodiment, data and signal communication is accomplished through bundled 7-wire data communications cables connected from the power supply and relay control box 300 external 7-pin connectors to an external 7-pin connector attached to each rack mount lifter (606, 608, 610, 612). Once the power supply and relay control box 300 is connected to the rack mount lifters (606, 608, 610, 612), the signal communication pathway from the remote control 400 through the power supply and relay control box 300 to the rack mount lifters (606, 608, 610, 612) is complete and the system may be activated to perform lift and lower actions for any equipment item or equipment rack to which the rack mount lifters (606, 608, 610, 612) have been attached.

Figure 7:
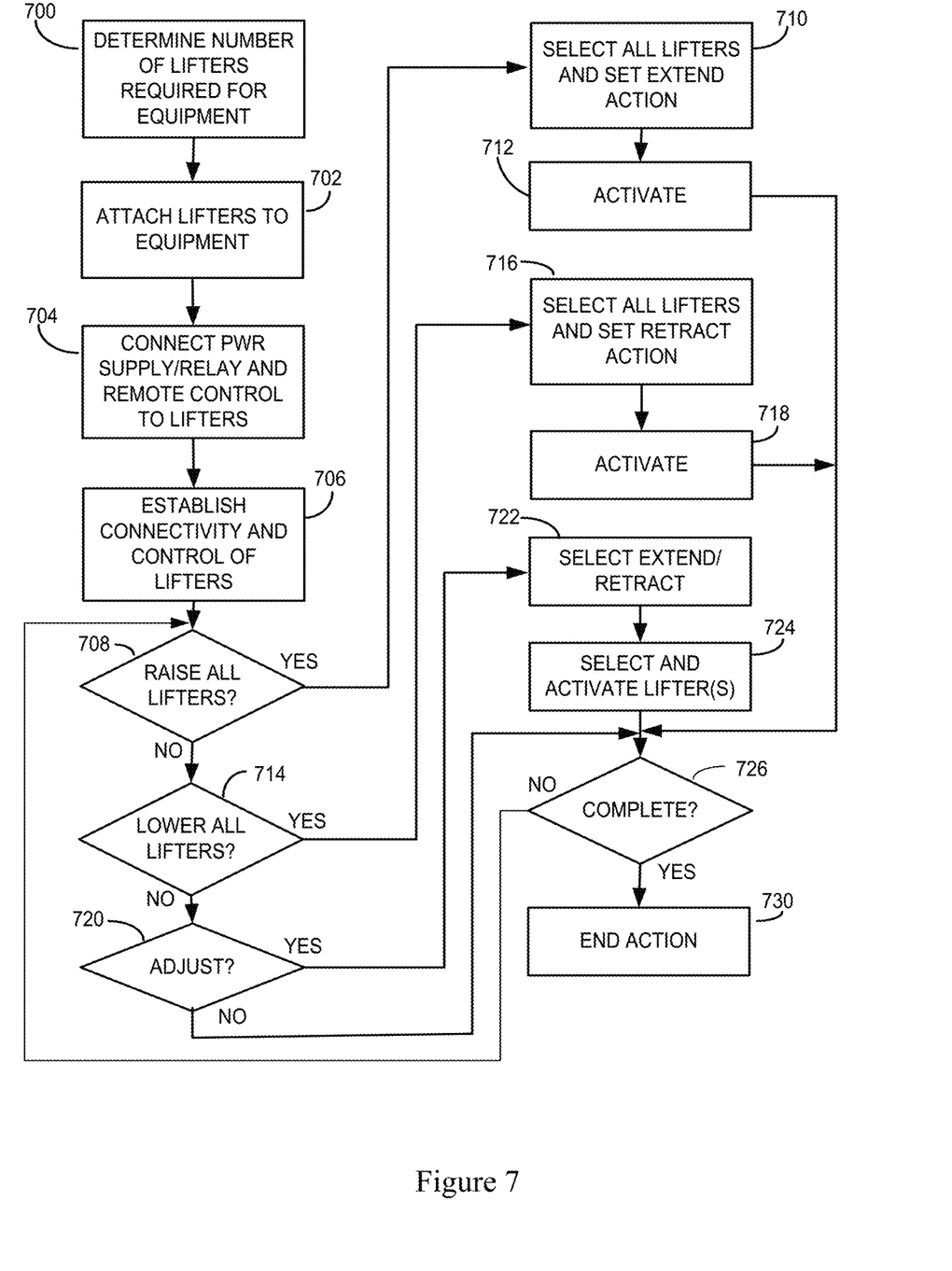
FIG. 7 is a view of an illustrative process for use of a rack mount lifter assembly when moving a fully loaded equipment rack consistent with certain embodiments of the present invention.

Turning now to FIG. 7 presents a view of an illustrative process for use of a rack mount lifter assembly when moving a fully loaded equipment rack consistent with certain embodiments of the present invention. In this exemplary embodiment an initial step in the configuration of the rack mount lifter assembly is presented at 700 with the determination of the number of lifters necessary to perform a relocation action for a particular equipment item or equipment rack. In a non-limiting example, when attempting to relocate a fully loaded datacenter equipment rack containing standardized rack mounted equipment, attaching a rack mount lifter to each of the four corners of the datacenter equipment rack 702 is sufficient to provide the force and stability necessary to raise, lower, and adjust the datacenter equipment rack during a repair or relocation action. Once the rack mount lifters have been attached to the equipment item or equipment rack 702, data and signal communication between the rack mount lifters and the power supply and relay control box 300 and the remote control 400 must be established 704. In a non-limiting example, the data and signal communication is accomplished through the connection of bundled 7-conductor wires between the rack mount lifters and the power supply/relay control and the remote control 400 by connecting the wires to 7-pin connectors attached to the exterior of the power supply/relay control box and the remote control 400. At 706, once data and signal communication wires have been connected to all elements of the rack mount lifter assembly, signal connectivity is established to provide control and signal message pathways from the remote control 400 to the rack lifters through the intermediation of the power supply and relay control box 300.

With connectivity of the rack mount lifter assembly established, at 708 the user may select the option of raising all lifters that are connected to the remote control 400. To perform this function the user must place the direction switch on the remote control 400 in the "UP" position 710 and select an "Activate All" button 712. The selection of the "UP" position and activation of all lifters attached to the equipment item or equipment rack will then have the effect of moving the equipment item or equipment rack up off of a floor or other horizontal surface until the user disengages the "Activate All" button on the remote control 400.

Instead of raising all lifters, at 714 the user may choose the option to lower all lifters connected to the remote control 400. To perform this function the user must place the direction switch on the remote control 400 in the "DOWN" position 716 and select an "Activate All" button 718. The selection of the "DOWN" position and activation of all lifters attached to the equipment item or equipment rack will then have the effect of moving the equipment item or equipment rack down toward a floor or other horizontal surface until the user disengages the "Activate All" button on the remote control 400, or until the equipment item or equipment rack is resting completely on the floor or other horizontal surface.

In the operation of the system the user may instead be required to adjust one or more rack lifters 720 with regard to either an "UP" or a "DOWN" position to maintain the equipment item or equipment rack in a level vertical and horizontal orientation such that the equipment item or equipment rack is not tilted substantially away from a vertical position. To perform this function the user may place the direction switch on the remote control 400 in either the "UP" position or in the "DOWN" position based upon the direction of travel required to maintain a substantially vertical position for the equipment item or equipment rack 722. The user may then select one or more rack lifter activate buttons based upon the adjustment required and the lifters necessary to achieve the required adjustment. The user may also select the "Activate All" button to perform an adjustment of all connected rack lifters simultaneously. The rack lifters will be activated upon selection and the application of pressure to the activate button(s) 726. The user may determine when the activation is complete 728 and either choose another action 708 or terminate the action and use of the rack mount lift assembly 730.

Figure 8:
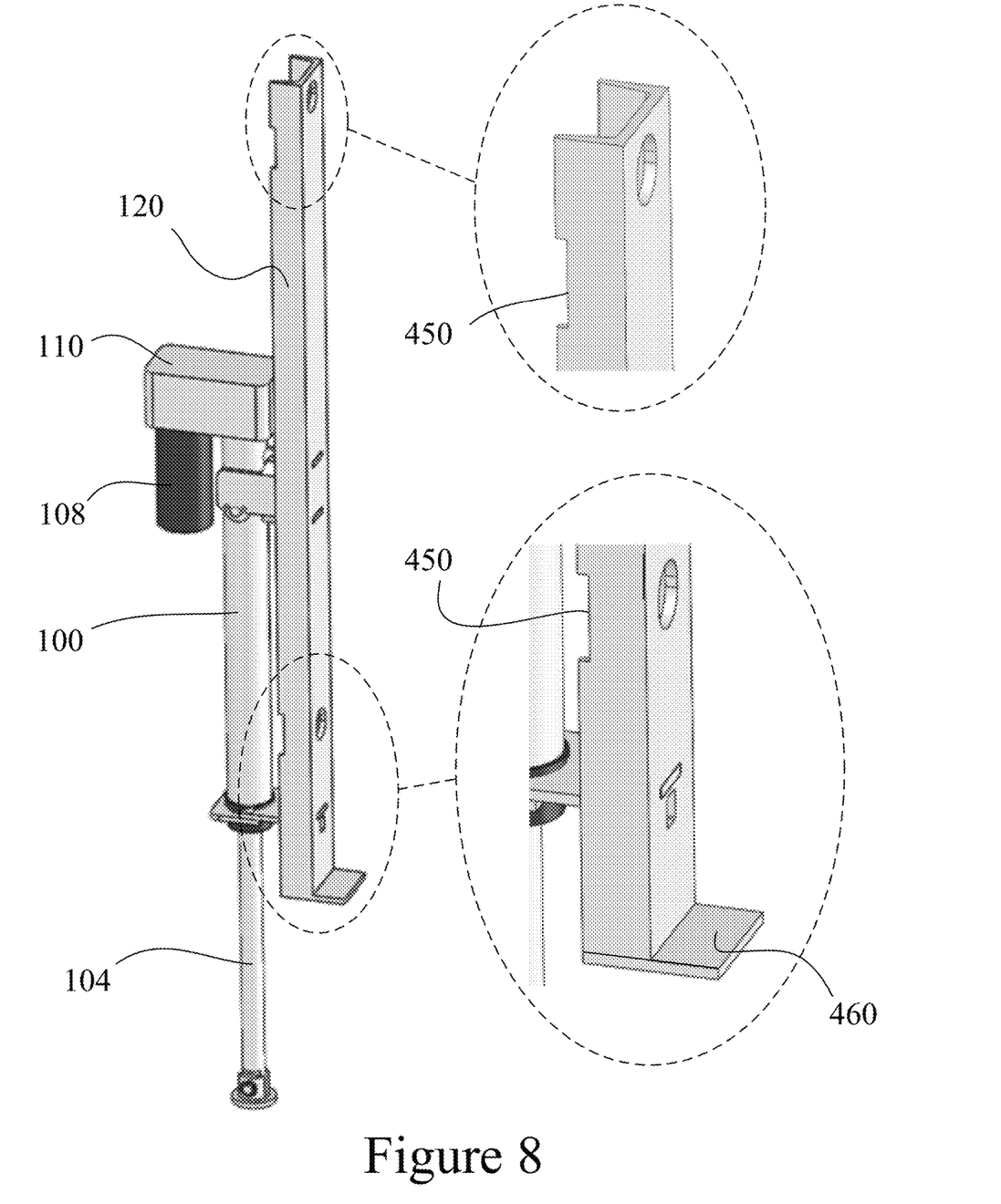
FIG. 8 is a detail view of portions of the actuator frame of one of the equipment lifting components illustrating the one or more pairs of retention notches and the lifting foot.

Turning now to FIG. 8, this figure illustrates the one or more pairs of retention notches 450 and the lifting foot 460 on one of the equipment lifting components. In an embodiment, the lifting foot 460 allows the rack lifter to lift a piece of equipment without requiring pre-existing lifting holes in the piece of equipment to be lifted. The lifting foot 460 may be placed under the bottom of a piece of datacenter equipment, such as a server rack, to lift from the bottom frame. The rack lifter(s) 100 may then be activated to raise the piece of equipment a sufficient height to permit a pallet, rack mount, or other moving equipment to be placed beneath the lifted piece of equipment. In a non-limiting example, the lifting foot 460 could either be a permanent or removeable element of the actuator frame 120 of the rack lifter 100. Additionally, the lifting foot 460 attached to the actuator frame 120 may have different configurations, such as being narrower, thinner, thicker, or wider to accommodate the piece or pieces of equipment that require lifting.

In an embodiment, the one or more pairs of retention notches 450 may be located on a top end, bottom end, or in the middle portion of the actuator frame 120. The retention notches 450 may be positioned to permit one, two, or more retention straps (not shown) to be wrapped around the actuator frame 120 and the piece of equipment to be lifted, simultaneously. The retention notches 450 retain the one or more retention straps to be held in position without slipping when the retention straps are positioned within the retention notches 450, regardless of motion of the piece of equipment as it is lifted.

The above overviews are intended to illustrate exemplary embodiments which will be best understood in conjunction with the detailed description to follow, and are not intended to limit the scope or meaning of the appended claims.

While certain illustrative embodiments have been described, it is evident that many alternatives, modifications, permutations and variations will become apparent to those skilled in the art in light of the foregoing description.

What is claimed is:

1. An apparatus for moving datacenter equipment in a vertical orientation, comprising:
   a plurality of equipment lifting components, each of them mountable to an item of equipment;
   a power supply;
   a relay control in electrical communication with each of the plurality of equipment lifting components; and
   a remote control in electrical communication with the relay control and configured to control the action of each of the plurality of equipment lifting components;
   an equipment lifting component comprising an actuator frame having a lifting foot located at the base of said actuator frame and configured to support an item of equipment at the base of said item of equipment during a lifting action; and one or more pairs of retention notches located on the back portion of said actuator frame.

2. The apparatus of claim 1, where each of the equipment lifting components comprise an electro-mechanical or hydraulic actuator in association with an electric activation motor, an external cylinder and an internal cylinder where the internal cylinder extends from and retracts into the external cylinder when the electric activation motor activates the electro-mechanical or hydraulic actuator.

3. The apparatus of claim 1, where the power supply is separate from the equipment lifting components.

4. The apparatus of claim 1, where the remote control comprises at least one activation switch for each equipment lifting component and an activation switch for activating all equipment lifting components simultaneously.

5. The apparatus of claim 1, where each individual equipment lifting component selected from the plurality of equipment lifting components comprises an actuator frame for attaching to the item of equipment;

where the actuator frame comprises one or more pairs of retention notches that prevent slippage of one or more ratchet straps that secure the item of equipment to the individual equipment lifting component.

6. The apparatus of claim 5, where the actuator frame comprises a lifting foot;

where the lifting foot is placed under the item of equipment to prevent the item of equipment from sliding down the side of the actuator frame.

7. The apparatus of claim 1, where the remote control is electrically connected to a power supply/relay control and said power supply/relay control is electrically connected to an activation motor associated with each equipment lifting component.

8. The apparatus of claim 1, where each equipment lifting component comprises a load-bearing element.

9. The apparatus of claim 8, where the equipment lifting component load bearing elements are connected to said item of equipment or an equipment rack in a configuration sufficient to support the weight of said item of equipment or said equipment rack during lifting actions.

10. A system for moving datacenter equipment in a vertical orientation, comprising:

a plurality of equipment lifting components, each of them mountable to an item of equipment;

a power supply;

a relay control in electrical communication with each of the plurality of equipment lifting components; and a remote control in electrical communication with the relay control and configured to control the action of each of the plurality of equipment lifting components;

an equipment lifting component comprising an actuator frame having a lifting foot located at the base of said actuator frame and configured to support an item of equipment at the base of said item of equipment during a lifting action; and one or more pairs of retention notches located on the back portion of said actuator frame.

11. The system of claim 10, where each of the equipment lifting components comprise an electro-mechanical or hydraulic actuator in association with an electric activation motor, an external cylinder and an internal cylinder where the internal cylinder extends from and retracts into the external cylinder when the electric activation motor activates the electro-mechanical or hydraulic actuator.

12. The system of claim 10, where the power supply is separate from the equipment lifting components.

13. The system of claim 10, where the remote control comprises at least one activation switch for each equipment lifting component and an activation switch for activating all equipment lifting components simultaneously.

14. The system of claim 13, where each individual equipment lifting component selected from the plurality of equipment lifting components comprises an actuator frame for attaching to the item of equipment;

where the actuator frame comprises one or more pairs of retention notches that prevent slippage of one or more ratchet straps that secure the item of equipment to the individual equipment lifting component.

15. The system of claim 10, further comprising an actuator frame that comprises a lifting foot;

where the lifting foot is placed under the item of equipment to prevent the item of equipment from sliding down the side of the actuator frame.

16. The system of claim 10, where the remote control is electrically connected to the power supply/relay control and the power supply/relay control is electrically connected to an activation motor associated with each equipment lifting component.

17. The system of claim 10, where each equipment lifting component comprises a load-bearing element.

18. The system of claim 17, where the equipment lifting component load bearing elements are connected to said item of equipment or an equipment rack in a configuration sufficient to support the weight of said item of equipment or equipment rack during lifting actions.

\* \* \* \* \*